(12) United States Patent
Gendron-Hansen et al.

(10) Patent No.: US 11,901,406 B2
(45) Date of Patent: Feb. 13, 2024

(54) SEMICONDUCTOR HIGH-VOLTAGE TERMINATION WITH DEEP TRENCH AND FLOATING FIELD RINGS

(71) Applicant: Analog Power Conversion LLC, Bend, OR (US)

(72) Inventors: Amaury Gendron-Hansen, Bend, OR (US); Dumitru Gheorge Sdrulla, Bend, OR (US)

(73) Assignee: Analog Power Conversion LLC, Bend, OR (US)

( * ) Notice: Subject to any disclaimer, the term of this patent is extended or adjusted under 35 U.S.C. 154(b) by 0 days.

(21) Appl. No.: 17/374,721

(22) Filed: Jul. 13, 2021

(65) Prior Publication Data

US 2023/0019985 A1    Jan. 19, 2023

(51) Int. Cl.
| | |
|---|---|
| *H01L 29/06* | (2006.01) |
| *H01L 21/765* | (2006.01) |
| *H01L 21/761* | (2006.01) |
| *H01L 29/40* | (2006.01) |

(52) U.S. Cl.
CPC ........ *H01L 29/0623* (2013.01); *H01L 21/761* (2013.01); *H01L 21/765* (2013.01); *H01L 29/402* (2013.01)

(58) Field of Classification Search
CPC ... H01L 29/0619–0623; H01L 29/0603; H01L 29/0642
See application file for complete search history.

(56) References Cited

U.S. PATENT DOCUMENTS

| | | | |
|---|---|---|---|
| 2008/0179671 A1 | 7/2008 | Saito | |
| 2015/0318347 A1* | 11/2015 | Falck | H01L 29/66348 257/494 |
| 2017/0178947 A1 | 6/2017 | Wisotzki | |
| 2018/0026129 A1 | 1/2018 | Ren | |
| 2018/0033627 A1 | 2/2018 | Dainese | |
| 2019/0067493 A1 | 2/2019 | Seok | |

OTHER PUBLICATIONS

International Search Report and Written Opinion dated Oct. 28, 2022 for International Application No. PCT/US2022/035999.

* cited by examiner

*Primary Examiner* — Julio J Maldonado
*Assistant Examiner* — Stanetta D Isaac

(57) ABSTRACT

A semiconductor device comprises a substrate, a semiconductor layer formed on the substrate; and a high-voltage termination. The high-voltage termination includes a plurality of floating field rings, a deep trench and a dielectric material is disposed within the deep trench. The plurality of floating field rings are formed in the semiconductor layer and respectively disposed around a region of the semiconductor layer. The deep trench is formed in the semiconductor layer and concentrically disposed around an outermost floating field ring of the plurality of floating field rings. The high-voltage termination may also include a field plate disposed over the floating field rings, the deep trench, or both.

9 Claims, 8 Drawing Sheets

| | | TH_TRENCH (μm) | | | | | |
|---|---|---|---|---|---|---|---|
| | | 7.0 | | | 3.2 | | |
| | $L_{FFR}$ | $V_R$ | $C_j$ | $Q_c$ | $V_R$ | $C_j$ | $Q_c$ |
| | | $I_R$=10 mA.cm$^{-1}$ | $V_R$=300 V | | $I_R$=10 mA.cm$^{-1}$ | $V_R$=300 V | |
| | (μm) | (V) | (pF) | (nC) | (V) | (pF) | (nC) |
| $N_{RING}$ | 6 | 14.55 | 1124 | 0.98 | 0.38 | 1124 | 0.98 | 0.38 |
| | 4 | 9.50 | 1124 | | | 1122 | | |
| | 2 | 4.65 | 1121 | | | 991 | | |
| | 0 | 0.00 | 907 | 0.39 | 0.12 | 778 | 0.57 | 0.17 |

SEMICONDUCTOR HIGH-VOLTAGE TERMINATION WITH DEEP TRENCH AND FLOATING FIELD RINGS

BACKGROUND

High-voltage semiconductor devices may require dedicated structures, known as high-voltage terminations, to prevent electrical breakdown at the peripheries of active regions of the semiconductor device.

In devices having blocking voltage ratings above 1700 V, the high-voltage terminations may occupy a substantial portion of the die area. In some such devices, over half the area of the device may be consumed by high-voltage terminations. This increases the die size of the device, which increases the cost of the device.

To reduce cost, it would be advantageous to have a more compact high-voltage termination (that is, one that occupied less die area) that still provides a high blocking voltage.

SUMMARY OF THE INVENTION

Embodiments relate to semiconductor devices and manufacturing processes thereof, and in particular to semiconductor devices that include a high-voltage termination at a periphery of an active region of the device.

In an embodiment, a semiconductor device includes a substrate, a semiconductor layer formed on the substrate, and a high-voltage termination. The high-voltage termination includes a plurality of floating field rings formed in the semiconductor layer and respectively disposed around a region of the semiconductor layer, a deep trench formed in the semiconductor layer and concentrically disposed around an outermost floating field ring of the plurality of floating field rings, and a dielectric material disposed within the deep trench.

The high-voltage termination may further include a field plate. The field plate may be disposed over one or more of the floating field rings, over a portion of the deep trench, or both.

In an embodiment, a method of manufacturing a semiconductor device comprises forming an epitaxial layer on semiconductor substrate, forming a plurality of floating field rings concentrically disposed in the epitaxial layer, forming a deep trench in the epitaxial layer and around the outermost floating field ring of the plurality of floating field rings; and forming a dielectric material within the deep trench.

In an embodiment, the method further comprises forming a field plate over the dielectric layer and over at least one of the floating field rings, at least a portion of the deep trench, or both.

DETAILED DESCRIPTION

Figure 1A:
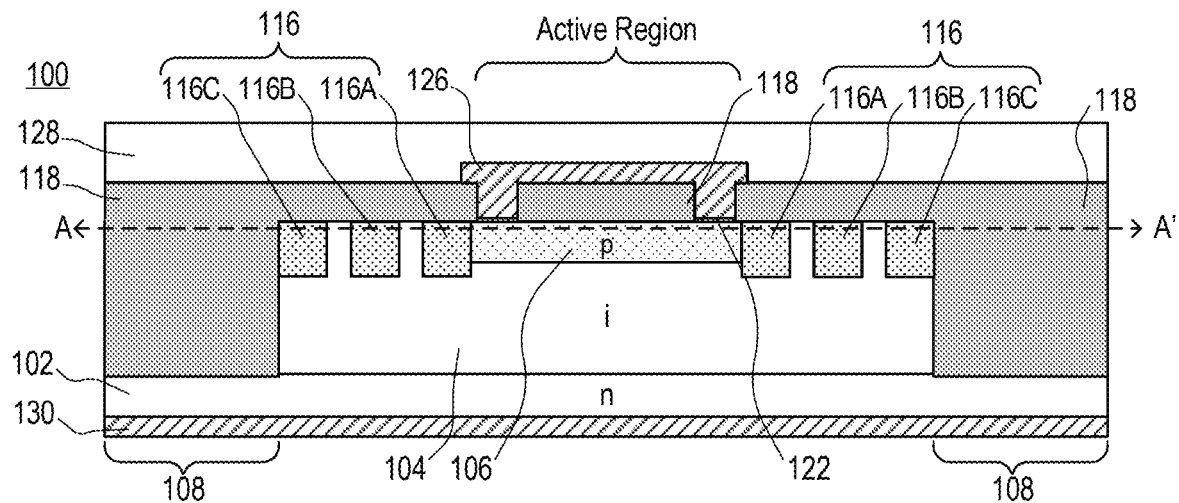
FIG. 1A shows a cross-section of a semiconductor device according to an embodiment.

Embodiments of the present application relate to semiconductor devices having high-voltage terminations. In embodiments, a high-voltage termination includes one or more floating field rings and a deep trench disposed around a periphery of an active region of a semiconductor devices.

As used herein, a deep trench is a trench whose bottom is deeper than a metallurgical junction of a pertinent doped region in the semiconductor, and that may penetrate through most of or an entirety of a layer of the semiconductor device that active devices are fabricated in and/or on, such as an epitaxial layer that may be used to fabricate a diode, a field effect transistor (FET), an insulated gate bipolar transistor (IGBT) a bipolar junction transistor (BJT), a thyristor, or the like. In embodiments, the pertinent doped region may be a floating field ring, and in particular may be a floating field ring adjacent to the deep trench.

The deep trench is generally lined with a first dielectric, such as an oxide. The deep trench may be filled with a second dielectric (which may be the same dielectric as used to line the deep trench) but embodiments are not limited thereto.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Power semiconductor devices require a dedicated high-voltage termination to avoid early breakdown at the active region periphery. Examples of high-voltage terminations include Floating Field Rings (FFRs) and deep trenches filled with an insulator. However, FFR terminations for high voltages may occupy a large die area. On the other hand, deep trench terminations may occupy less die area but at the expense of a lower blocking voltage. And all structures used for high-voltage termination come with a significant parasitic capacitance which negatively affects the high-frequency switching performance and, depending on the design and material used, have hysteresis properties, unsuitable for high-frequency operations.

Super-junction technologies commonly rely on deep trench etch and semiconductor epitaxial growth fill. The focus of these technologies is optimizing the trade-off between a low on-state resistance and a high blocking voltage. In particular, super-junction devices can break conventional silicon limits for power semiconductor devices. However, this concept is not suitable for high-voltage terminations and super-junction devices need specific high-voltage termination designs.

Embodiments include a high-voltage termination for a semiconductor device, the high-voltage termination comprising one or more FFRs and a deep trench filled with a dielectric layer and disposed adjacent to one of the FFRs. The number of FFRs may be less than the number of FFRs required for a high-voltage termination of the related arts having the same voltage rating but not having the deep trench, and accordingly combining the deep trench with the FFRs may produce a high-voltage termination occupying a smaller area of the die than the high-voltage termination of the related arts.

Embodiments are particularly well-suited for silicon carbide (SiC) technologies (which may have a thin epitaxy layer and high-voltage rating) but is also applicable to a wide range of other semiconductor materials, including but not limited to silicon and gallium nitride (GaN).

FIG. 1A illustrates a semiconductor device 100 according to an embodiment. In FIG. 1A the device 100 is a vertical PIN diode, but embodiments are not limited thereto.

The device 100 comprises a substrate 102 of a semiconductor material on which an epitaxial layer (hereinafter, the epitaxy 104) has been formed. The epitaxy 104 may be grown on the substrate 102. The substrate 102 may be of the same semiconductor material as the epitaxy 104 but may be more heavily doped (and therefore have a higher conductivity) than the epitaxy 104.

In embodiments, the substrate 102 and epitaxy 104 may include a wide bandgap semiconductor such as SiC, and may be n-type material, but embodiments are not limited thereto. For example, in embodiments, the substrate 102 and epitaxy 104 may include silicon or GaN. In other embodiments, the substrate 102 and epitaxy 104 may be p-type material.

A doped region 106 is formed in the epitaxy 104 in an area surrounded by a deep trench 108. In the illustrated PIN diode, the doped region 106 is a p-type region, but embodiments are not limited thereto.

First, second, and third floating field rings 116A, 116B, and 116C (collectively, floating field rings 116) are formed in the epitaxy 106 around the periphery of the doped region 106. The floating field rings 116 are doped regions of the same type as the doped region 106. In embodiments, the floating field rings 116 are more heavily doped than the doped region 106.

The deep trench 108 is filled with an dielectric 118 that is also disposed over the top of the epitaxy 104 and the doped region 106. In embodiments, the dielectric 118 may include silicon dioxide ($SiO_2$), polyimide, benzocyclobutene, spin-on glass, or combinations thereof.

The floating field rings 116 and the deep trench 108 operate together as a compact high-voltage termination. In operation, the blocked voltage across the PIN diode is split between the floating field rings 116 and the deep trench 108. In embodiments, the voltage sustained in the floating field rings 116 is more than the difference between the breakdown voltage of the deep trench 108 and the one-dimensional breakdown voltage of the epitaxy 104.

A first electrode 126 is formed over and in electrical contact with the doped region 106. The first electrode 126 provides an electrical connection to an anode of the PIN diode comprised of the doped region 106, the portion of the epitaxy 104 below the doped region 106, and the substrate 102.

In an embodiment, the first electrode 126 may comprise aluminum, among other conductors, and may be electrically connected to the doped region 106 through a thin conductive layer 122, which in an embodiment may comprise nickel silicide. In another embodiment, the first electrode 126 may comprise gold.

A second electrode 130 comprising a conductor (such as silver or gold, along with other interface elements for adhesion) is formed over a bottom surface of the substrate 102 and provides an electrical connection to a cathode of the PIN diode.

A passivation layer 128 is formed over the electrode 126 and the dielectric 118. In embodiments, the passivation layer comprises silicon oxynitride (SiON).

Figure 1B:
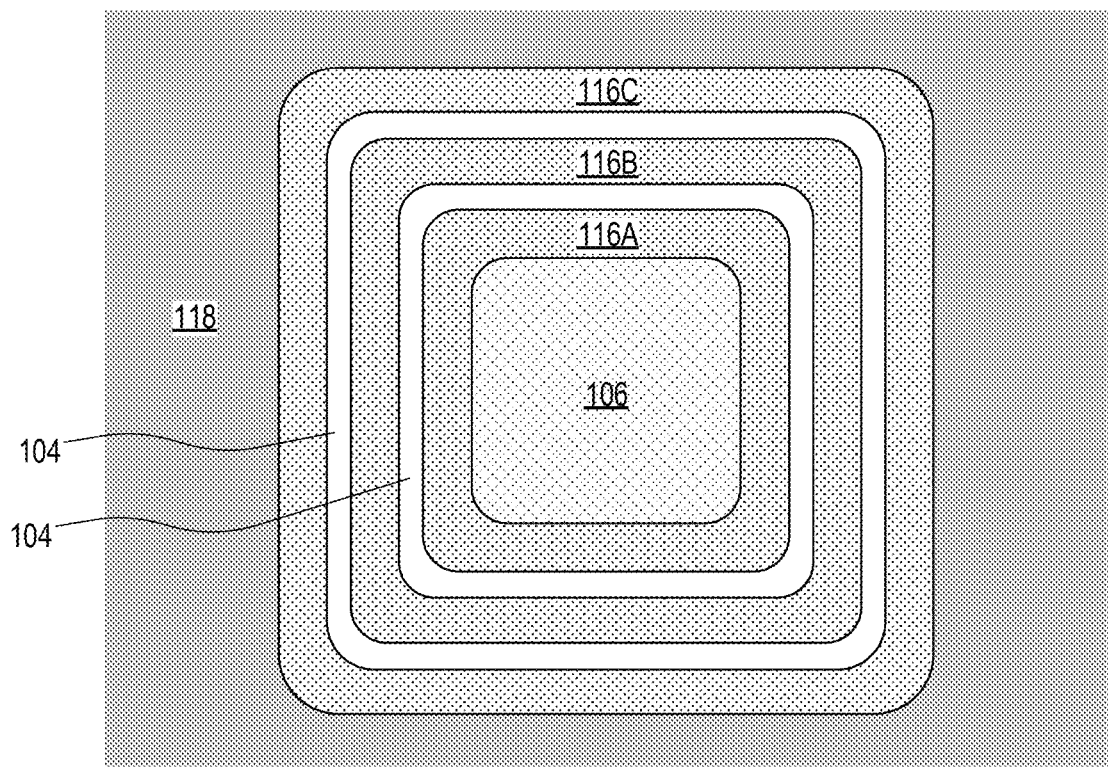
FIG. 1B shows a plan view of a semiconductor device according to an embodiment.

FIG. 1B shows a plan view of the semiconductor device 100 of FIG. 1A along the line A-A' according to an embodiment. FIG. 1B shows the first, second, and third floating field rings 116A, 116B, and 116C concentrically disposed around the active region defined by the doped region 106, and the dielectric filling the deep trench 108 disposed around the third floating field ring 116C (the outermost floating field ring).

FIG. 1B shows the doped region 106 having the shape of a square with rounded corners, and the floating field rings 116 having shapes of square rings with rounded corners, but embodiments are not limited thereto. In an embodiments, the rounded square shapes may instead be circular shapes, or may be rounded rectangular shapes, and so on.

FIGS. 2A through 2D illustrate embodiments of semiconductor devices like the semiconductor device 100 of FIG. 1A that further include field plates as part of the high-voltage termination. FIG. 2E illustrates an embodiment wherein the deep trench is disposed differently than in the semiconductor device 100 of FIG. 1A.

Figure 2A:
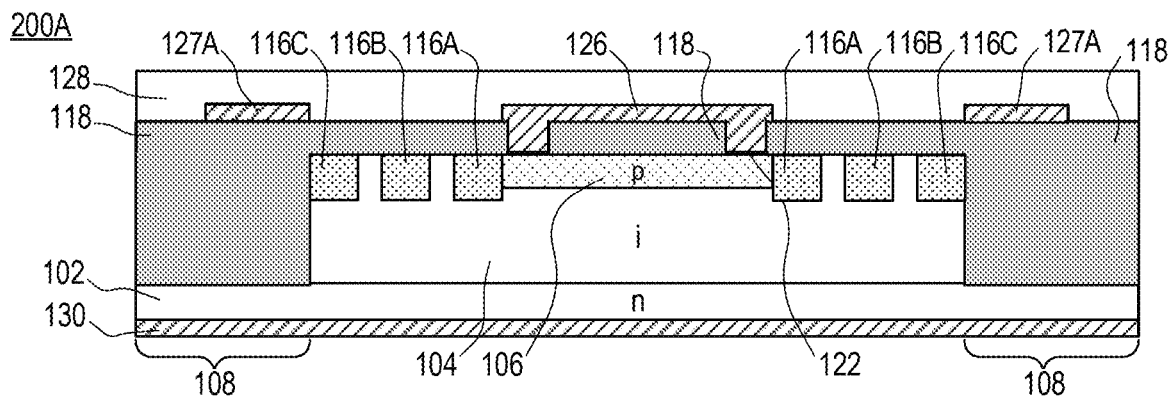
FIGS. 2A through 2E show respective cross-sections of semiconductor devices according to other respective embodiments.

FIG. 2A shows a cross-section of a semiconductor device 200A according to an embodiment. The semiconductor device 200A differs from the semiconductor device 100 of FIG. 1A in that semiconductor device 200A includes a field plate 127A disposed over the deep trench 108. In plan view, the field plate 127A may be a circular, elliptical, or rounded-rectangular ring, but embodiments are not limited thereto.

In the embodiment of FIG. 2A, the field plate 127A is a floating field plate; that is, the field plate 127A is not conductively connected to any other structure in the semiconductor device 200A; however, embodiments are not limited thereto.

Figure 2B:
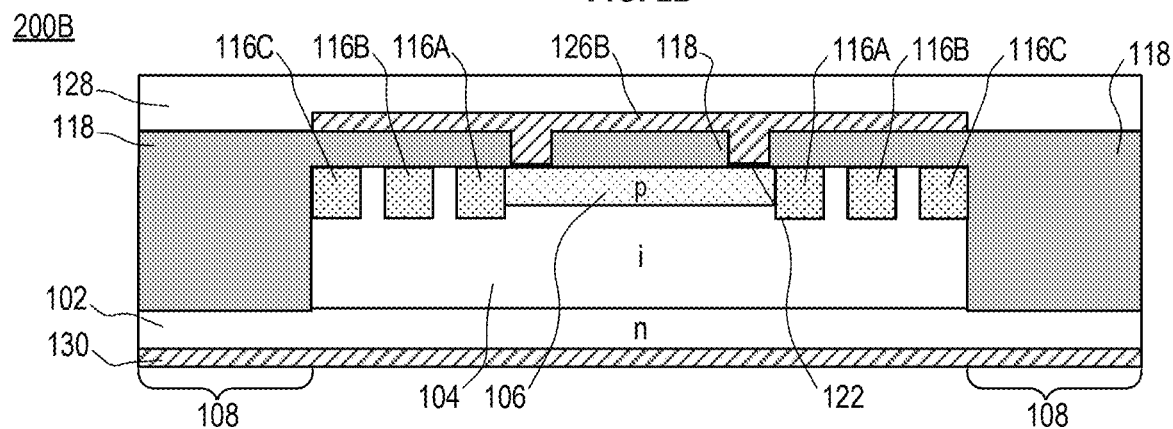

FIG. 2B shows a cross-section of a semiconductor device 200B according to another embodiment. The semiconductor device 200B differs from the semiconductor device 100 of FIG. 1A in that unlike the first electrode 126 of the semiconductor device 100, the first electrode 126B of the semiconductor device 200B is formed not only over the doped region 106 but also over the floating field rings 116. The portion of the first electrode 126B formed over the floating field rings 116 operates as a "grounded" field plate.

In the embodiment of FIG. 2B, the grounded field plate portion of the first electrode 126B extends over all of the floating field rings 116, but embodiments are not limited thereto, and in embodiments, the grounded field plate portion of the first electrode 126B may extend over only some of the floating field rings 116.

Figure 2C:
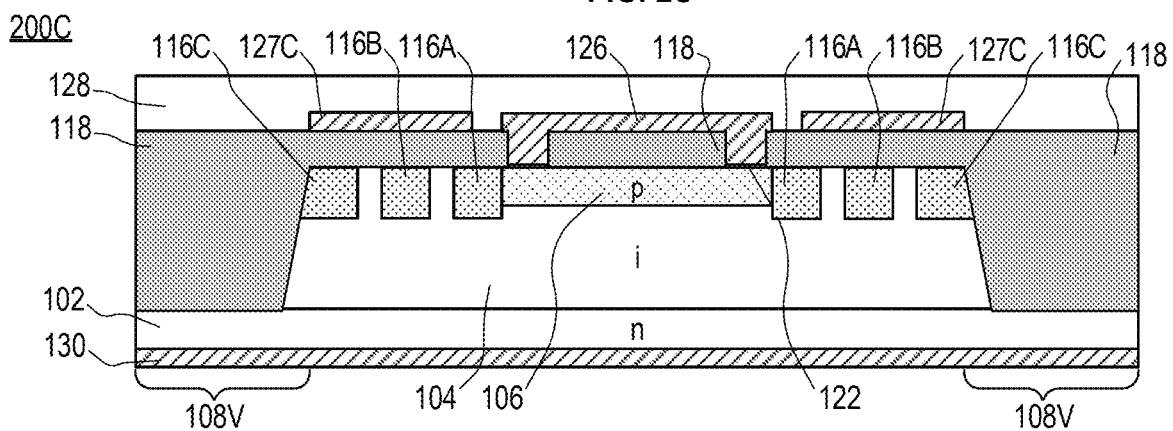

FIG. 2C shows a cross-section of a semiconductor device 200C according to another embodiment. The semiconductor device 200C differs from the semiconductor device 100 of FIG. 1A in that semiconductor device 200C includes a field plate 127C disposed over the floating field rings 116, and that the sidewalls of the deep trench 108V are sloped. In plan view, the field plate 127C may be a circular, elliptical, or rounded-rectangular ring, but embodiments are not limited thereto.

In the embodiment of FIG. 2C, the field plate 127C is a floating field plate.

In the embodiment of FIG. 2C, the field plate 127C extends over all of the floating field rings 116, but embodiments are not limited thereto, and in embodiments, the field plate 127C may extend over only some of the floating field rings 116.

In embodiments, the field plate 127C may also extend over the deep trench 108V.

Figure 2D:
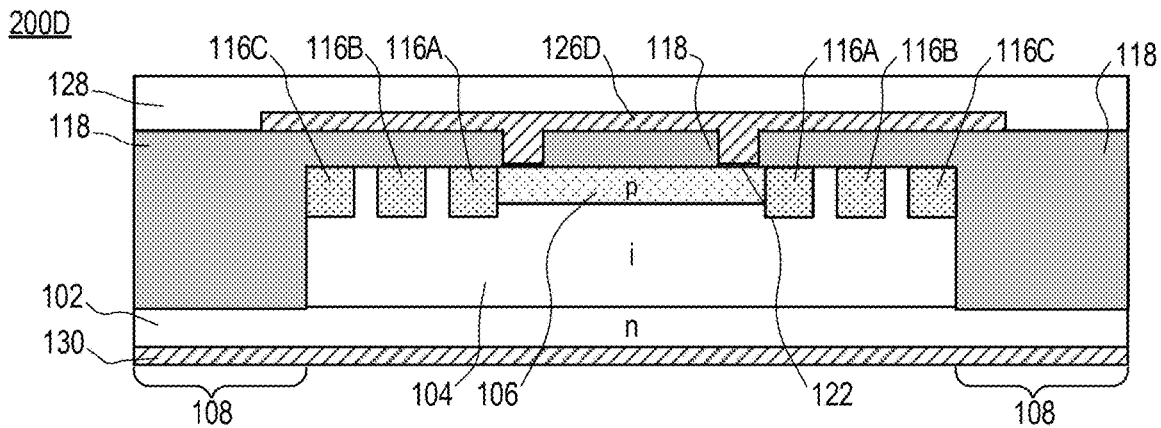
Figure 2E:
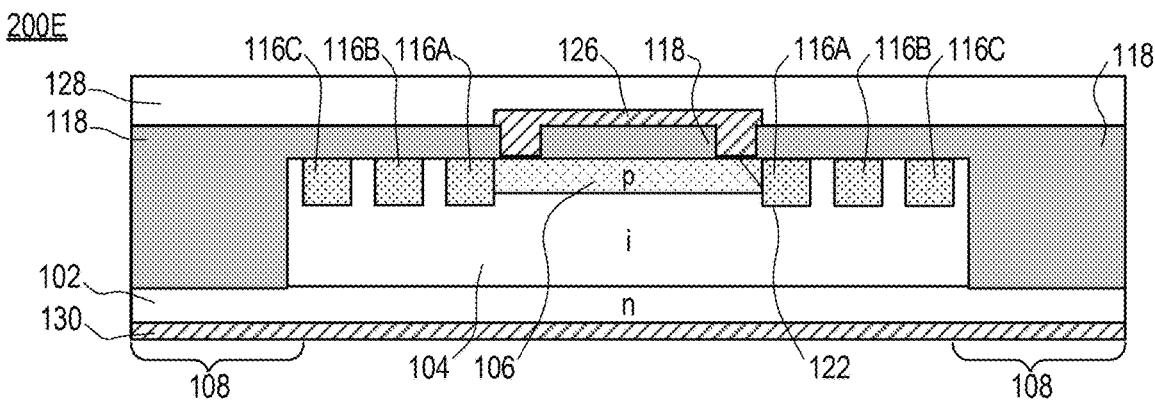

FIG. 2D shows a cross-section of a semiconductor device 200D according to another embodiment. The semiconductor device 200D differs from the semiconductor device 200B of FIG. 2B in that unlike the first electrode 126B of the semiconductor device 200B, the first electrode 126D of the semiconductor device 200D is formed not only over the doped region 106 and the floating field rings 116 but also over the deep trench 108. The portion of the first electrode 126D formed over the floating field rings 116 and the deep trench 108 operates as a "grounded" field plate.

FIG. 2E shows a cross-section of a semiconductor device 200E according to another embodiment. The semiconductor device 200E differs from the semiconductor device 100 of FIG. 1A in that the trench 108 of the semiconductor device 200E is not disposed adjacent to the third floating field ring 116C (the outermost floating field ring), but is instead separated from the third floating field ring 116C, in this embodiment by a portion of the epitaxy 104.

Figure 3:
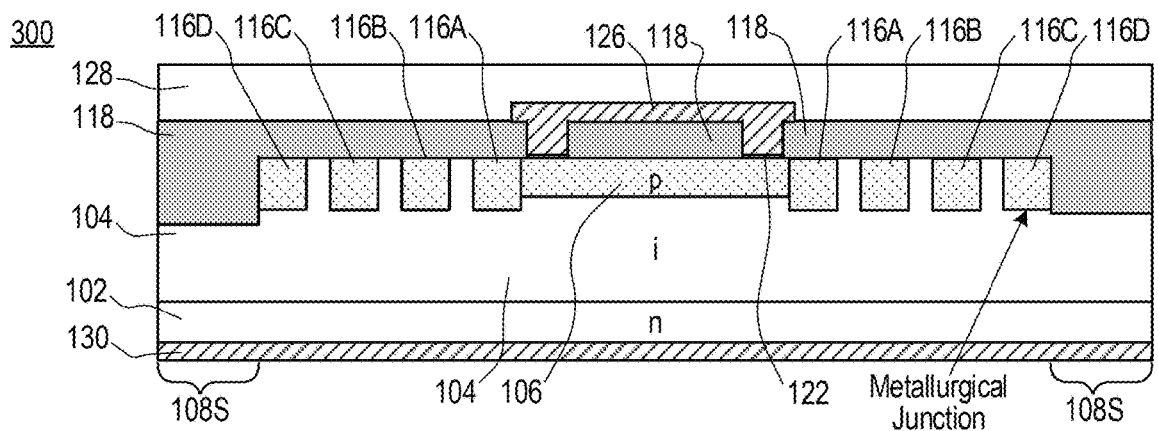
FIG. 3 shows a cross-section of a semiconductor device according to another embodiment.

FIG. 3 illustrates a cross-section of a semiconductor device 300 according to another embodiment. The device 300 differs from the device 100 of FIG. 1A in that:
  the deep trench 108S of FIG. 3 is not as deep as the deep trench 108 of FIG. 1A, and
  a fourth floating field ring 116D is disposed between the third floating field ring 116C and the deep trench 108S
The trench 108S is still a deep trench because it is deeper than the metallurgical junction between the bottom of the fourth floating field ring 116D (that is, the outermost floating field ring) and the epitaxy 104.

The semiconductor device 300 has the additional fourth floating field ring 116D to compensate for the deep trench 108S being less effective at providing a blocking voltage (that is, having a lower breakdown voltage) than the deep trench 108 of FIG. 1A, due to the deep trench 108S being shallower than the deep trench 108.

FIGS. 4A through 8D illustrate processes of forming a semiconductor device according to several embodiments. Where a structure shown in FIGS. 4A through 8D may be created using techniques that are well-known in the related arts (for example, the forming of layers by deposition followed by photolithography) descriptions of the well-known techniques may be omitted in the interest of brevity.

FIGS. 4A through 4D illustrate steps in a semiconductor device manufacturing process according to an embodiment. Numbers of the form 1xx appearing in FIG. 1A correspond to numbers in the form 4xx in FIGS. 4A through 4D, and respectively correspond to the substantially identical structures.

Figure 4A:
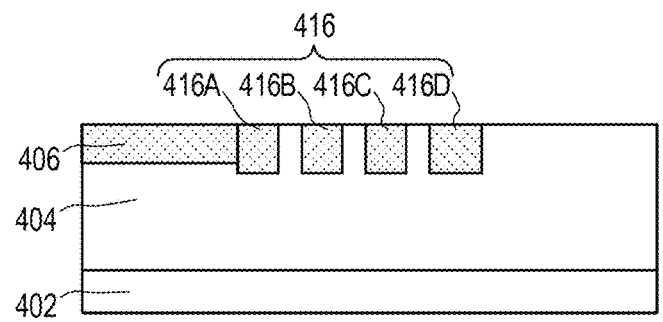
FIGS. 4A through 4D illustrate steps in a semiconductor device manufacturing process according to an embodiment.

FIG. 4A shows a substrate 402, an epitaxy 404, a doped region 406, and first, second, third, and fourth floating field rings 416A, 416B, 416C, and 416D (collectively, floating field rings 416).

Figure 4B:
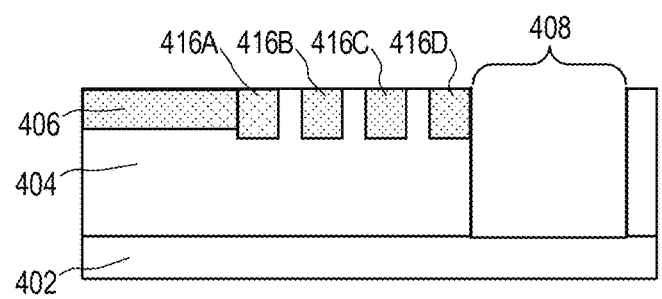

At FIG. 4B, a deep trench 408 has been formed through a full depth of the epitaxy 404 and a small amount into the substrate 402. However, embodiments are not limited thereto, and in embodiments, the deep trench 408 stops part way into the epitaxy 404, like the deep trench 108S of FIG. 3. A portion of the fourth floating field ring 416D was removed during the deep trench formation so that the metallurgical junction between the fourth floating field ring 416D and the epitaxy 404 ends in contact with the side-wall of the deep trench 408.

Figure 4C:
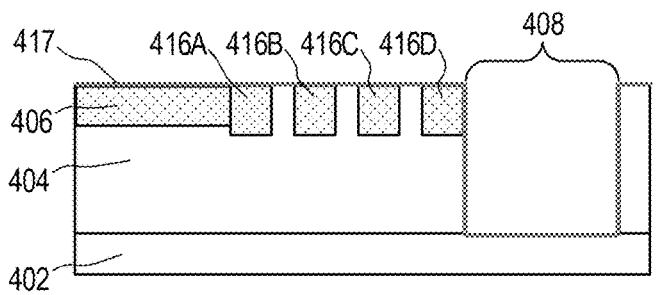

At FIG. 4C, a thin oxide layer 417 has been formed over the surface of the deep trench 408 and over the top surface of the doped region 406, the floating field rings 416, and the epitaxy 404. The thin oxide layer 417 may comprise silicon dioxide grown by thermal oxidation. In an embodiment, the thin oxide layer 417 is a sacrificial oxide that is removed before the deep trench 408 is filled. In another embodiment, the thin oxide layer 417 is a liner oxide that is left in place.

Forming the thin oxide layer 417 passivates the surface of the deep trench 408, which can improve, among other characteristics, the leakage current and the breakdown voltage of the device. However, forming the thin oxide layer 417 is optional.

Figure 4D:
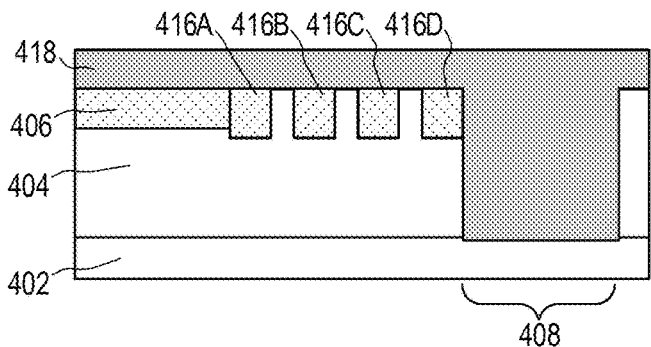

At FIG. 4D, a thicker dielectric layer 418 has been formed in the deep trench 408 and over the top of the doped region 406, the floating field rings 416, and the epitaxy 404. In embodiments where the thin oxide layer 417 is formed, the dielectric layer 418 may incorporate the thin oxide layer 417 of FIG. 4C. In embodiments, the dielectric layer 418 may comprise silicon dioxide.

Figure 5:
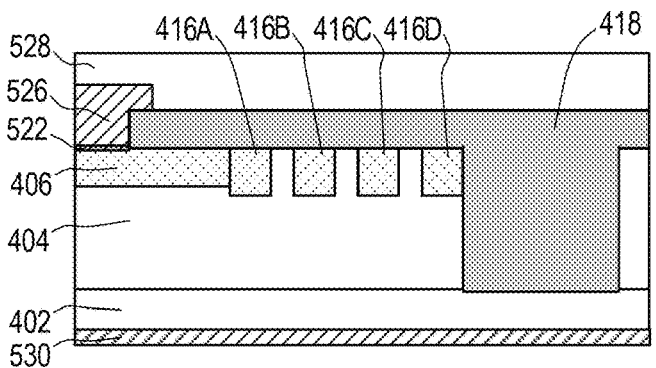
FIG. 5 illustrates a step occurring after the steps shown in FIGS. 4A through 4D in a semiconductor device manufacturing process according to an embodiment.

FIG. 5 illustrates the result of further steps performed after the steps of FIGS. 4A through 4D in a semiconductor device manufacturing process according to an embodiment.

At FIG. 5, a first contact opening has been formed through the dielectric layer 418 to expose a portion of the doped region 406, an thin conductive layer 522 (comprising, in an embodiment, nickel silicide) has been formed in the first contact opening, and a first electrode 526 has been formed over the thin conductive layer 522 and a portion of the dielectric layer 418. A passivation layer 528 has been formed over the first electrode 526 and the dielectric layer 418. A second electrode 530 has been formed over a bottom surface of the substrate 402.

In embodiments, one or more steps performed to produce the features shown in FIG. 5 requires a temperature in excess of 600° C. For example, the forming of the thin conductive layer 522 may require an annealing step that uses a temperature above 1000° C. for several minutes. Accordingly, in embodiments, features formed by the manufacturing process illustrated by steps 4A through 4D must be able to tolerate such high temperatures without degradation. As a result, in some embodiments, filling the deep trench 408 with materials (such as polyimide or benzocyclobutene (BCB)) that are incompatible with high-temperature processing may be prohibited.

FIGS. 6A through 6D illustrate steps in a semiconductor device manufacturing process according to an embodiment. Numbers of the form 4xx appearing in FIGS. 4A through 4D correspond to numbers in the form 6xx in FIGS. 6A through 6D, and respectively correspond to the substantially identical structures.

Figure 6A:
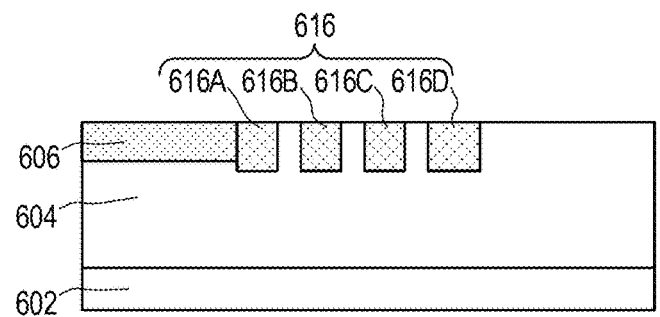
FIGS. 6A through 6D illustrate steps in a semiconductor device manufacturing process according to an embodiment.

FIG. 6A shows a substrate 602, an epitaxy 604, a doped region 606, and first, second, third, and fourth floating field rings 616A, 616B, 616C, and 616D (collectively, floating field rings 616).

Figure 6B:
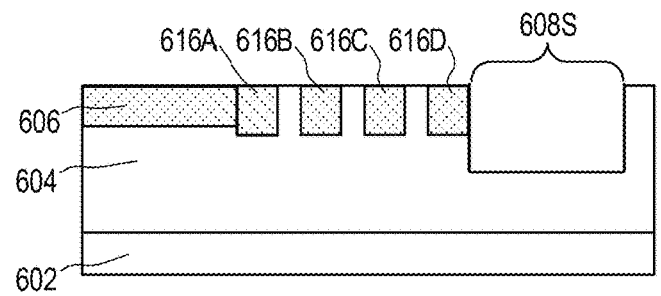

At FIG. 6B, a deep trench 608S has been formed part way through the epitaxy 604. The deep trench 608S extends at least far enough into the epitaxy 604 that the bottom of the deep trench 608S is lower than the metallurgical junction between the fourth floating field ring 616D and the epitaxy 604. A portion of the fourth floating field ring 616D was removed during the deep trench formation so that the metallurgical junction between the fourth floating field ring 616D and the epitaxy 604 ends in contact with the side-wall of the deep trench 608S.

Figure 6C:
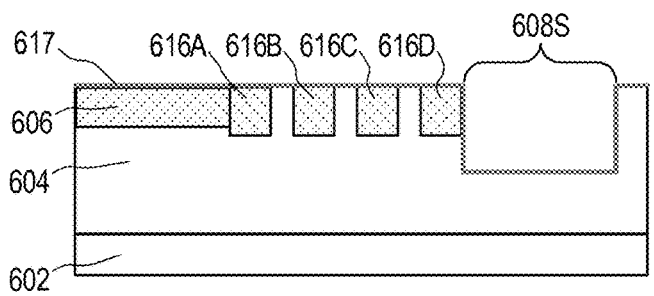

At FIG. 6C, a thin oxide layer 617 has been formed over the surface of the deep trench 608S and over the top surface of the doped region 606, the floating field rings 616, and the epitaxy 604. The thin oxide layer 617 may comprise silicon dioxide grown by thermal oxidation.

Forming the a thin oxide layer 617 passivates the surface of the deep trench 608S, which can improve, among other characteristics, the leakage current and the breakdown voltage of the device. However, forming the thin oxide layer 617 is optional.

Figure 6D:
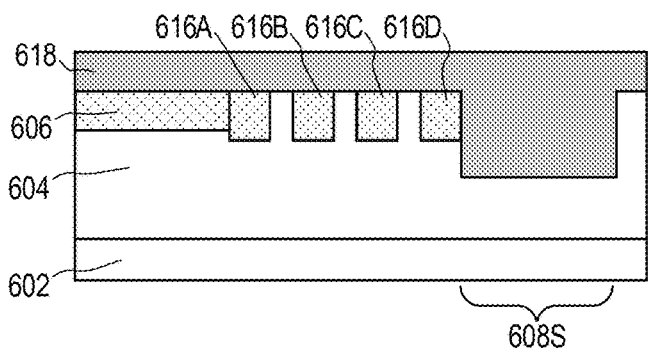

At FIG. 6D, a thicker dielectric layer 618 has been formed in the deep trench 608S and over the top of the doped region 606, the floating field rings 616, and the epitaxy 604. In embodiments where the thin oxide layer 617 is formed, the dielectric layer 618 may incorporate the thin oxide layer 617 of FIG. 6C. In embodiments, the dielectric layer 618 may comprise silicon dioxide.

Figure 7:
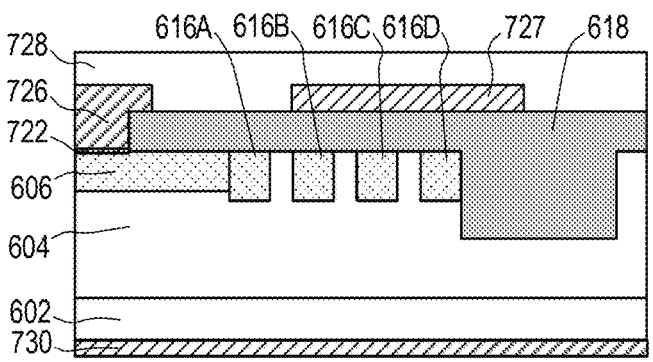
FIG. 7 illustrates a step occurring after the steps shown in FIGS. 6A through 6D in a semiconductor device manufacturing process according to an embodiment.

FIG. 7 illustrates the result of further steps performed after the steps of FIGS. 6A through 6D in a semiconductor device manufacturing process according to an embodiment.

At FIG. 7, a first contact opening has been formed through the dielectric layer 618 to expose a portion of the doped region 606, a thin conductive layer 722 has been formed in the first contact opening, and a first electrode 726 has been formed over the thin conductive layer 722 and a portion of the dielectric layer 618. A floating field plate 727 has been formed over the second, third and fourth floating field rings 616B, 616C and 616D and over a portion of the deep trench 608S. A passivation layer 728 has been formed over the first electrode 726, the floating field plate 727, and the dielectric layer 618. A second electrode 730 has been formed over a bottom surface of the substrate 602.

In embodiments, one or more steps performed to produce the features shown in FIG. 7 requires a temperature in excess of 600° C. For example, the forming of the thin conductive layer 722 may require an annealing step that uses a temperature above 1000° C. for several minutes. Accordingly, in embodiments, features formed by the manufacturing process illustrated by steps 6A through 6D must be able to tolerate such high temperatures without degradation. As a result, in some embodiments, filling the deep trench 608S with materials (such as polyimide or benzocyclobutene (BCB)) that are incompatible with high-temperature processing may be prohibited.

FIGS. 8A through 8D illustrate additional steps performed after the steps shown in FIGS. 4A through 4D in a semiconductor device manufacturing process according to an embodiment. In particular, FIGS. 8A through 8D show steps in the fabrication of a simplified Vertical Metal Oxide Semiconductor Field Effect Transistor (VMOSFET). Numbers of the form 8xx appearing FIG. 8A through 8D correspond to numbers in the form 4xx in FIGS. 4A to 4D, and respectively correspond to the substantially identical structures.

Figure 8A:
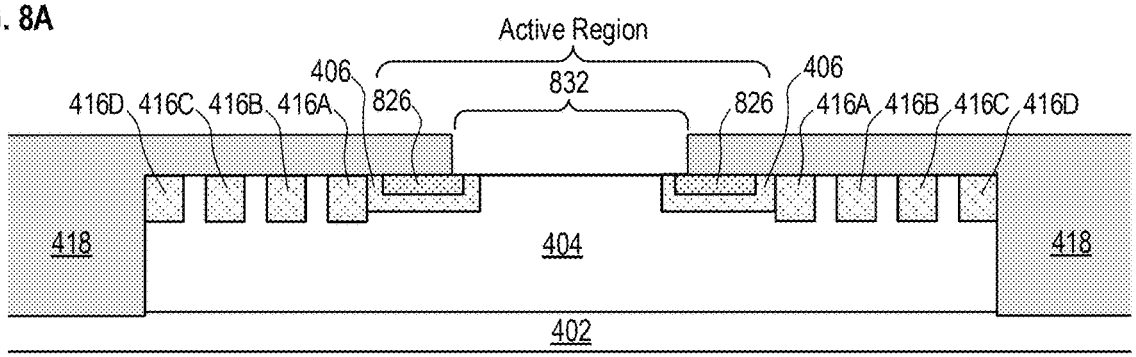
FIGS. 8A through 8D illustrate additional steps performed after the steps shown in FIGS. 4A through 4D in a semiconductor device manufacturing process according to an embodiment.

Before the deposition of the dielectric layer 418 shown in FIG. 8A, a doped source region 826 was formed in the doped regions 406. In embodiments where the doped regions 406 may be p-type material, the doped source region 826 may be n-type material.

Figure 8B:
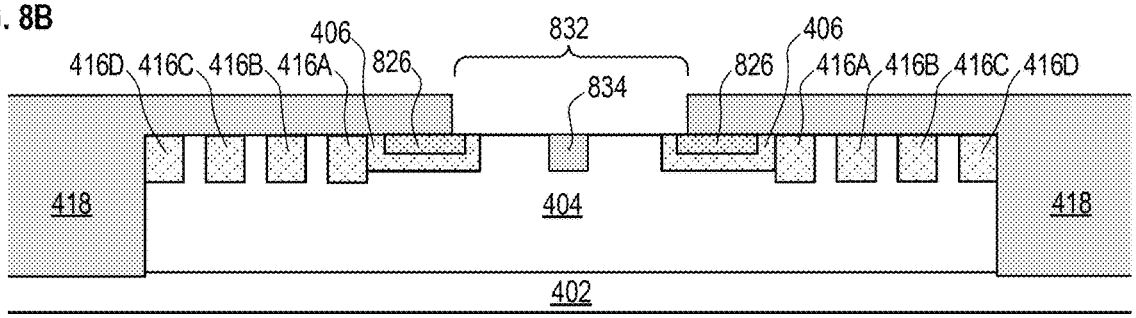
Figure 8C:
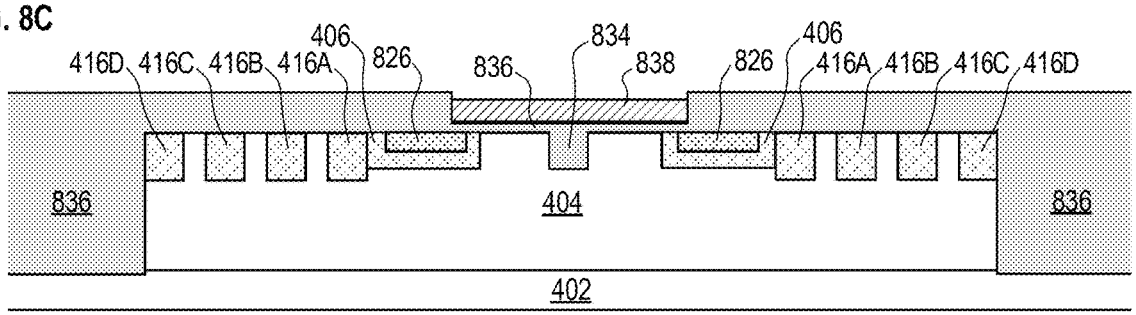
Figure 8D:
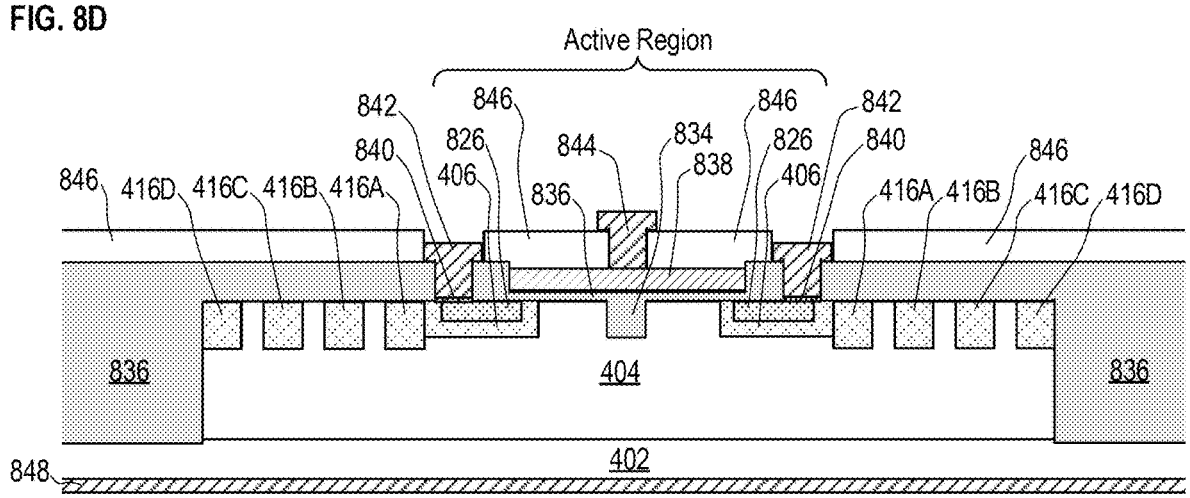

In embodiments, one or more steps performed between the step shown in FIG. 8A and the step shown in FIG. 8D requires a temperature in excess of 600° C. For example, the forming of a thin conductive layer on SiC, as described below, may require an annealing step that uses a temperature above 1000° C. for several minutes. Accordingly, in embodiments, features formed by the manufacturing process illustrated by steps 8A through 8D must be able to tolerate such high temperatures without degradation.

At FIG. 8A, an opening 832 has been formed in the dielectric layer 418 over an active region of the epitaxy 404 and over portions of the doped regions 406 and portions of the doped source region 826. Here, the doped regions 406 correspond to p-wells defining the doping in the channels of a VMOSFET, though some details of the doped regions 406 well-known in the art are not shown in the interest of clarity.

At FIG. 8B, a shallow trench has been formed in the middle of the active region inside the opening 832, and a dielectric layer 834 has been formed in the shallow trench. In other embodiments, the formation and filling of the shallow trench may be omitted.

At FIG. 8C, additional dielectric has been formed to create a dielectric layer 836, which may include the dielectric layers 418 and 834. A portion of the dielectric layer 836 comprises a gate dielectric, and a gate electrode 838 has been formed (in an embodiment, from doped polysilicon) over the gate dielectric portion of the dielectric layer 836.

At FIG. 8D, a passivation layer 846 has been formed over the dielectric layer 836 and the gate electrode 838. The passivation layer 846 may comprise, for example, borophosphosilicate glass (BPSG). Openings have been formed in the passivation layer 846 and the dielectric layer 836 to expose portions of the doped regions 406, the doped source region 826, and the gate electrode 838.

Thin conductive layers 840 have been formed over the surfaces of the doped regions 406 and 826 exposed in the openings in the dielectric layer 836, and in an embodiment comprise nickel silicide. A source electrode 842 has been formed to provide electrical connection to the doped regions 406 and the doped source region 826 through the thin conductive layers 840.

A gate contact 844 has been formed to provide electrical connection to the gate electrode 838. A drain electrode 848 has been formed over a bottom surface of the substrate 402.

Accordingly, FIG. 8D shows an intermediate stage of a process of manufacturing a VMOSFET having high-voltage terminations formed at a periphery of an active region of the VMOSFET and using a one or more floating field rings and a deep trench.

Figures 9, 10:
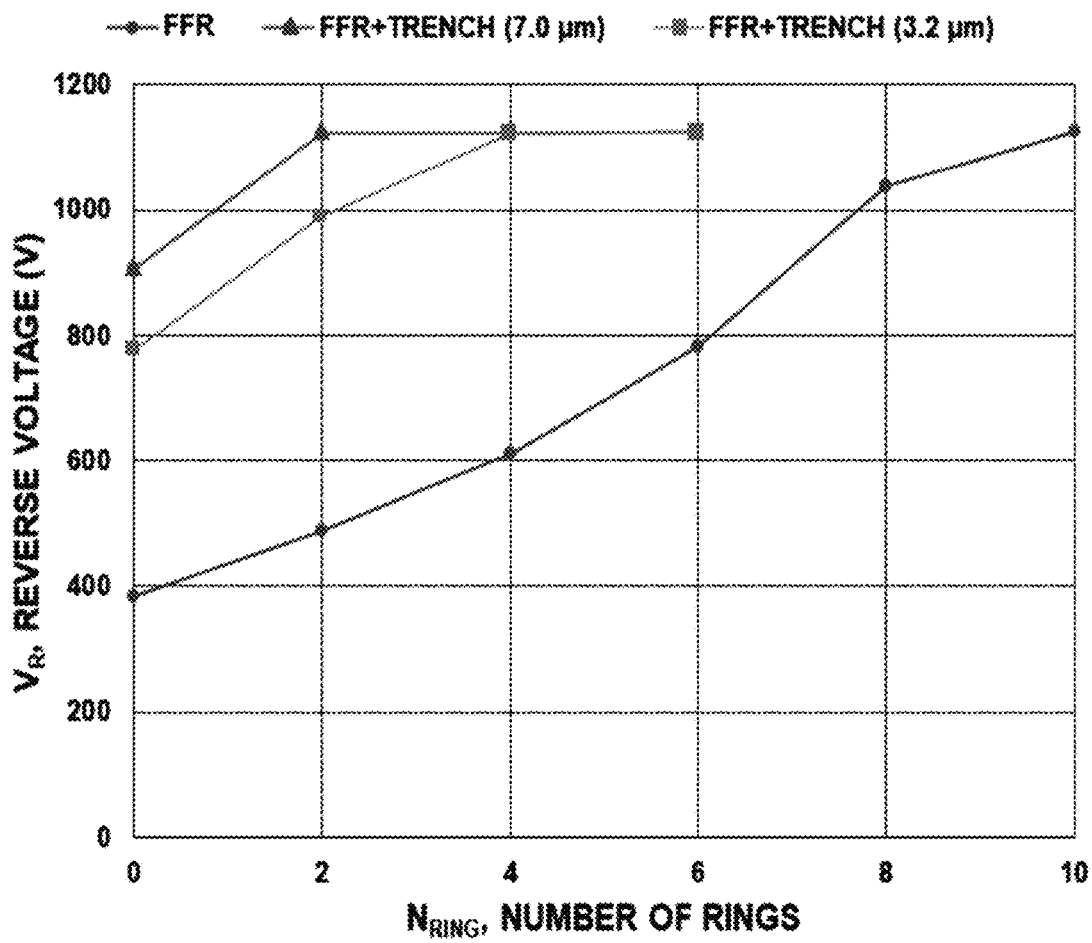
FIG. 9 shows electrical characteristics of semiconductor devices according to embodiments.
FIG. 10 is a graph of reverse breakdown voltages for semiconductor devices according to embodiments.

FIG. 9 shows electrical characteristics of devices according to embodiments. In particular, FIG. 9 shows a reverse breakdown voltage $V_R$, a junction capacitance $C_J$ at 300 V, and a gate charge $Q_C$ at 300 V for semiconductor devices fabricated using an epitaxy with a thickness of 6.4 µm, wherein a high-voltage termination of each of the semiconductor devices includes a deep trench having a depth $TH_{TRENCH}$ of either 7.0 µm (that is, all the way through the epitaxy) or of 3.2 µm, and with a number of floating field rings $N_{RING}$ of 0, 2, 4, or 6. The floating field rings length $L_{FFR}$ shows the distance from the inside of the innermost floating field ring to the outside of the outermost floating field ring in the embodiments shown.

FIG. 10 is a graph of the reverse breakdown voltages $V_R$ for the devices of FIG. 9 and for a device having floating field rings but no deep trench.

As can be seen in FIGS. 9 and 10, the addition of a deep trench increases the reverse voltages $V_R$ compared to a device with the same number of floating field rings and no deep trench. The high-voltage termination with a 7.0 µm-deep trench practically achieves its highest possible reverse voltage $V_R$ with only 2 floating field rings. The high-voltage termination with a 3.2 µm-deep trench practically achieves its highest possible reverse voltage $V_R$ with 4 floating field rings. In contrast, the high-voltage termination with no deep trench needs 10 floating field rings to achieve its highest possible reverse voltage $V_R$.

As can also be seen in FIG. 9, the junction capacitance $C_J$ and gate charge $Q_C$ are predominantly determined by the floating field rings and are less affected by the dimensions of the deep trench. The operating frequency of a device according to an embodiment may be limited by the junction capacitance $C_J$.

FIGS. 9 and 10 demonstrate that the deep trench depth and the number of floating field rings used in a high-voltage termination according to an embodiment may be selected according to a desired die area, a desired reverse blocking voltage, and a desired operating frequency. In an embodiment, the voltage sustained in the floating field rings is more than the difference between the deep trench breakdown voltage and the one-dimensional breakdown voltage of the epitaxy.

Figure 11:
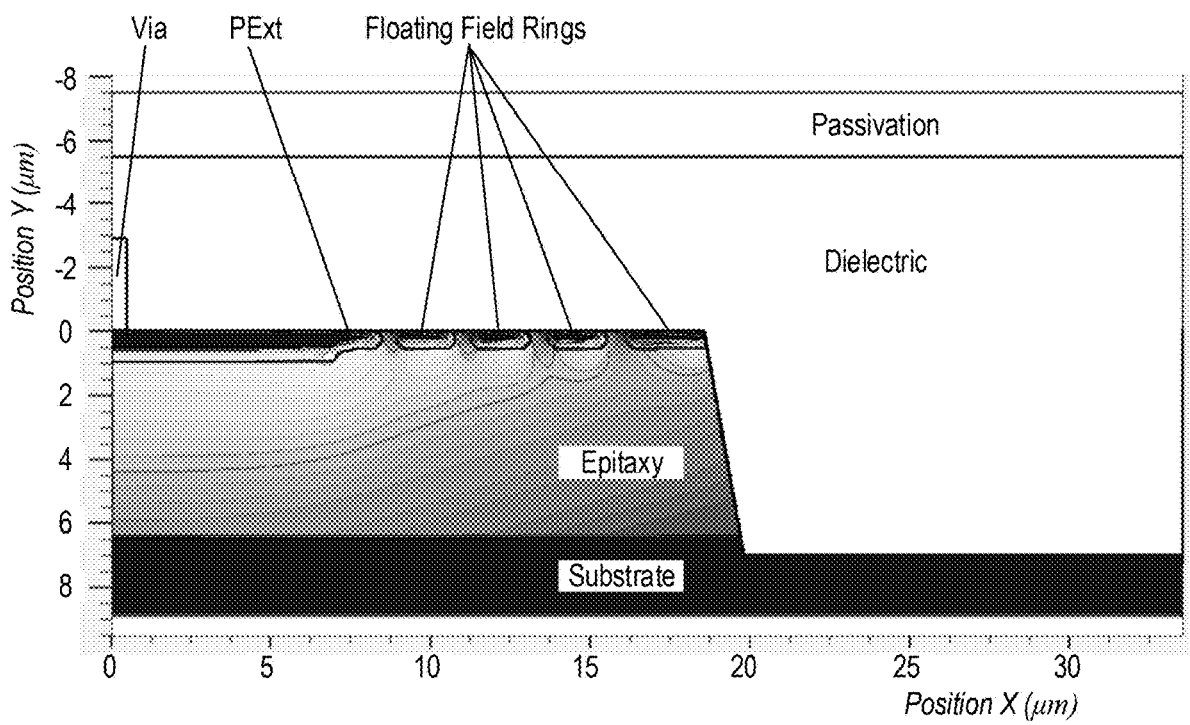
FIG. 11 shows the electric field distribution at avalanche breakdown for a semiconductor device according to an embodiment.
Figure 12:
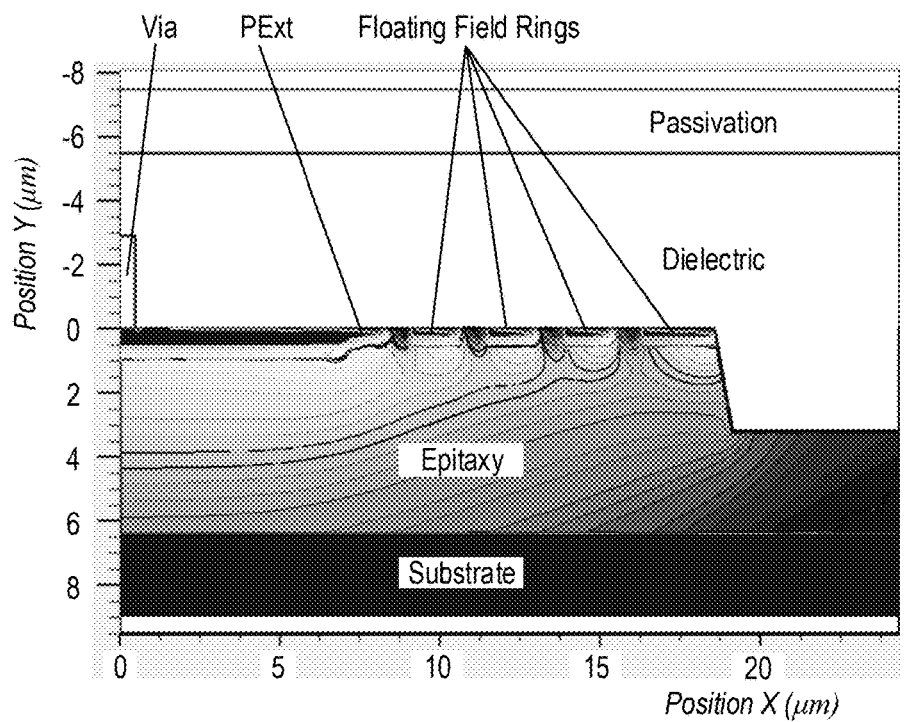
FIG. 12 shows the electric field distribution at avalanche breakdown for a semiconductor device according to another embodiment.

FIG. 11 shows the electric field distribution at avalanche breakdown in a semiconductor device having a high-voltage termination comprising four floating field rings and a deep trench that penetrates the entire depth of the epitaxy (herein after, the "full depth termination"), according to an embodiment. FIG. 12 shows the electric field distribution at avalanche breakdown in a semiconductor device having a high-voltage termination comprising four floating field rings and a deep trench that penetrates down to half the depth the epitaxy (herein after, the "half depth termination"), according to another embodiment.

As can be seen in FIGS. 11 and 12, the contour lines of the electric field for the full depth termination are straighter and more evenly spaced than the contour lines of the electric field for the half depth termination. Because of this, for a given reverse voltage, the half depth termination will have regions of epitaxy with higher changes in the electric field per unit distance, and accordingly the maximum reverse voltage that may be sustained by the half depth termination will be lower than the maximum reverse voltage that may be sustained by the full depth termination.

Illustrative embodiments have been provided wherein one or more floating field rings and a deep trench are disposed at a periphery of an active region of a semiconductor device to form a high-voltage termination. The high-voltage termination may further comprise a field plate disposed over some or all of the one or more field rings, over the deep trench, or both. The field plate if present may be floating or "grounded." Such high-voltage terminations may provide a high reverse blocking voltage without consuming as much die area as high-voltage terminations of the related art, thus reducing the cost of semiconductor devices including such high-voltage terminations.

Aspects of the present disclosure have been described in conjunction with the specific embodiments that are presented as illustrative examples, but embodiments are not limited to those shown in the drawings or those mentioned in the accompanying text. Numerous alternatives, modifications, and variations to the disclosed embodiments may be made without departing from the scope of the claims set forth below. Embodiments disclosed herein are not intended to be limiting.

What is claimed is:

1. A semiconductor device comprising:
   a substrate;
   a semiconductor layer formed on the substrate;
   an active device formed in or on a region of the semiconductor layer; and
   a high-voltage termination comprising:
      a plurality of floating field rings formed in the semiconductor layer and respectively disposed around the region of the semiconductor layer,
      a deep trench formed in the semiconductor layer, the deep trench being concentrically disposed around an outermost floating field ring of the plurality of floating field rings and having a bottom deeper than a doped region of the active device, and
      a dielectric material disposed within the deep trench.

2. The semiconductor device of claim 1, wherein the high-voltage termination comprises a field plate disposed over at least one of the floating field rings.

3. The semiconductor device of claim 1, wherein the high-voltage termination comprises a field plate disposed over at least a portion of the deep trench.

4. The semiconductor device of claim 1, wherein the high-voltage termination comprises a floating field plate.

5. The semiconductor device of claim 1, wherein the high-voltage termination comprises a field plate electrically connected to the doped region.

6. The semiconductor device of claim 1, wherein the plurality of floating field rings respectively comprise doped regions of the semiconductor layer.

7. The semiconductor device of claim 1, wherein the doped region corresponds to the outermost floating field ring.

8. The semiconductor device of claim 1, wherein at least one sidewall of the deep trench is sloped.

9. The semiconductor device of claim 1, wherein the semiconductor layer comprises an epitaxial layer grown on the substrate and including silicon, silicon carbide, or gallium nitride.

* * * * *